United States Patent [19]

Hasegawa et al.

[11] Patent Number: 5,195,866
[45] Date of Patent: Mar. 23, 1993

[54] CONVEYING APPARATUS

[75] Inventors: Isahiro Hasegawa, Zushi; Satoshi Kaneko, Yokohama, both of Japan

[73] Assignee: Tokyo Electron Limited, Tokyo, Japan

[21] Appl. No.: 799,999

[22] Filed: Nov. 29, 1991

[30] Foreign Application Priority Data

Nov. 29, 1990 [JP] Japan .................. 2-334210

[51] Int. Cl.⁵ ............................. B65G 65/00
[52] U.S. Cl. ....................... 414/749; 414/744.5; 198/468.9
[58] Field of Search ............. 198/468.9, 478.1, 750; 414/744.5, 749; 901/15, 28, 29

[56] References Cited

U.S. PATENT DOCUMENTS

| | | | |
|---|---|---|---|
| 4,483,654 | 11/1984 | Koch et al. | 414/744.5 |
| 4,666,366 | 5/1987 | Davis | 414/744.5 X |
| 4,730,976 | 3/1988 | Davis et al. | 414/749 |
| 4,909,701 | 3/1990 | Hardegen et al. | 414/749 |

FOREIGN PATENT DOCUMENTS

| | | | |
|---|---|---|---|
| 0044985 | 4/1977 | Japan | 414/744.5 |
| 60-183736 | 9/1985 | Japan . | |
| 61-87351 | 5/1986 | Japan . | |
| 0180572 | 7/1990 | Japan | 414/744.5 |
| 0292153 | 12/1990 | Japan | 414/744.5 |
| 0311237 | 12/1990 | Japan | 414/749 |
| 1278201 | 12/1986 | U.S.S.R. | 414/749 |

Primary Examiner—Robert P. Olszewski
Assistant Examiner—James R. Bidwell
Attorney, Agent, or Firm—Oblon, Spivak, McClelland, Maier & Neustadt

[57] ABSTRACT

The conveying apparatus comprises a pair of first arms provided in a spaced-apart relation and rotated with two first supporting points as their centers, a pair of second arms rotated with second supporting points as their centers, the second supporting points being provided on the end portions of the paired first arms, a support member having two supporting points rotatably supporting the end portions of the paired second arms, the support member supporting an article to be conveyed, a mechanism for moving the support member away from the base by moving the first and second arms into a superimposed state, and a mechanism capable of changing at least one of a distance between the first supporting points and distance between the third supporting points, or a flexible area provided on at least one of the pair of first arms and pair of second arms allowing the pair of first arms or pair of second arms to be deformed in their longitudinal direction.

17 Claims, 9 Drawing Sheets

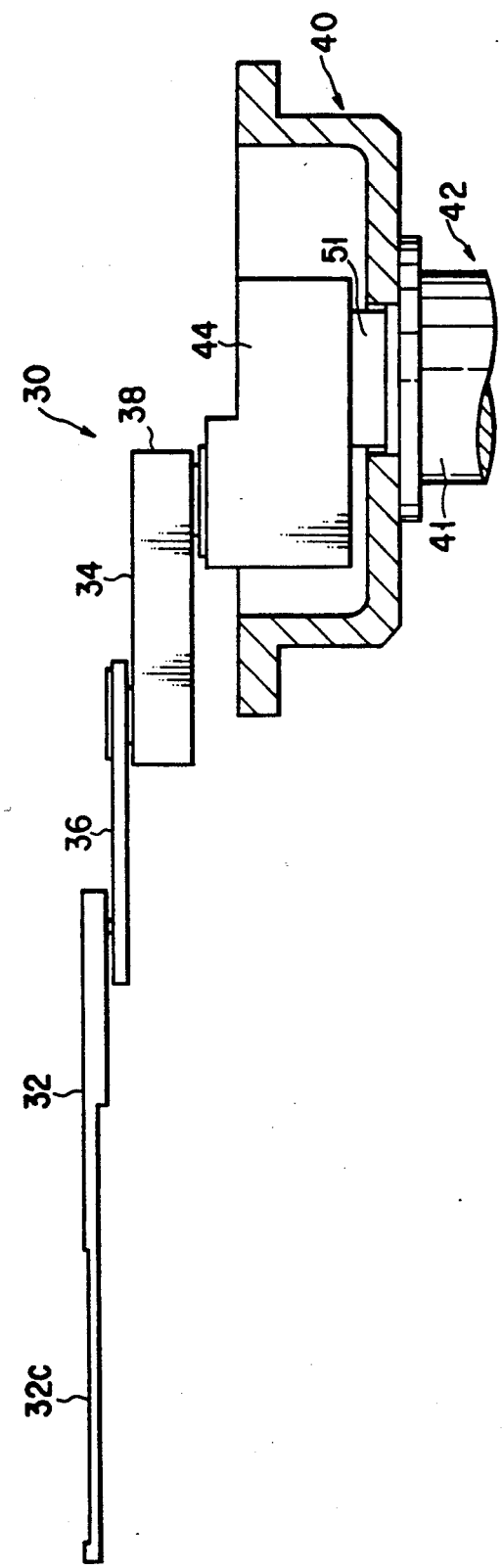
F I G. 4

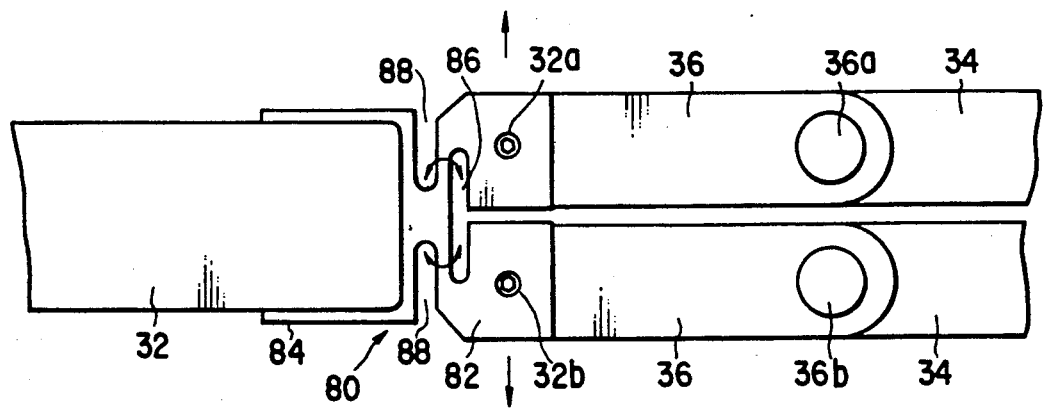
F I G. 7
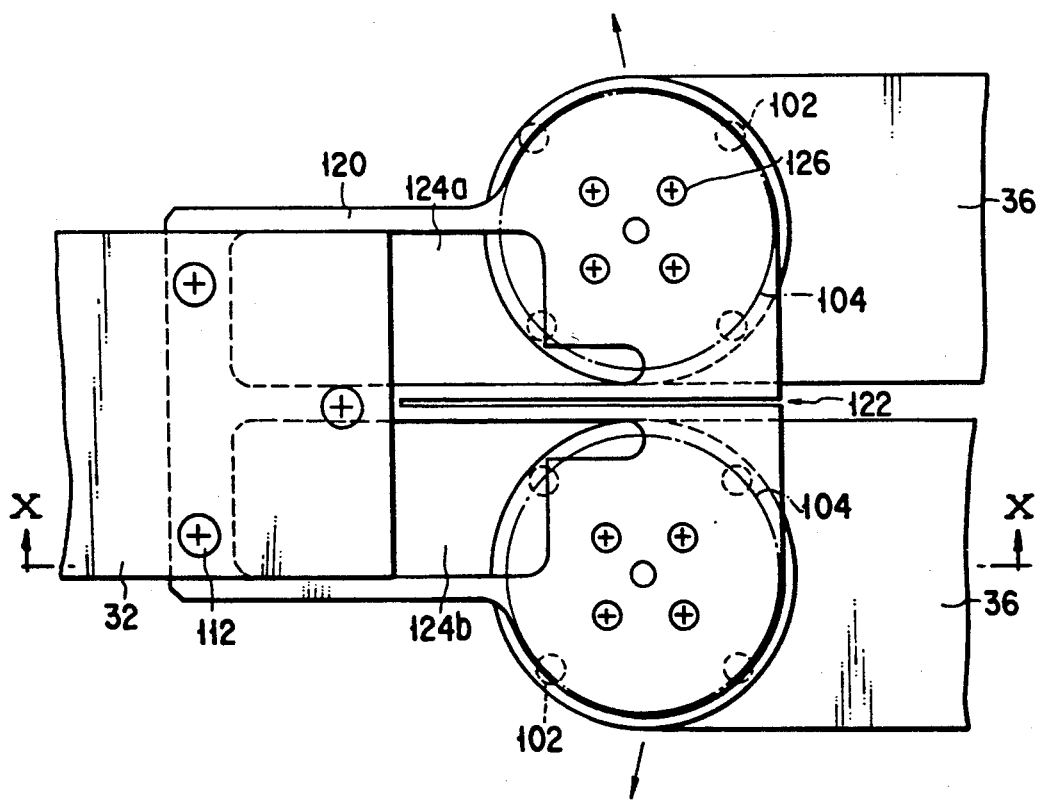
F I G. 8

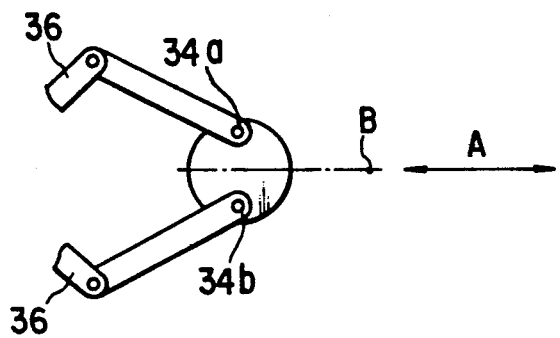
F I G. 12
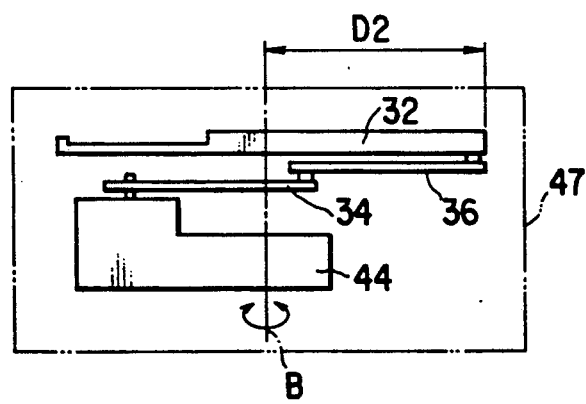
F I G. 13

CONVEYING APPARATUS

BACKGROUND OF THE INVENTION

1. Field of the Invention

The present invention relates to a conveying apparatus and, in particular, to a frog-leg type conveying apparatus for conveying an article by those arms actuated like frog legs.

2. Description of the Related Art

Conventionally, a semiconductor device manufacturing apparatus often employs a frog leg type conveying apparatus for conveying a semiconductor wafer. The conveying apparatus comprises a pair of first arms rotated with two first supporting points as their centers, the two first supporting points being provided on a base in a spaced-apart relation; a pair of second arms rotated with two second supporting points as their centers, the two second supporting points being provided on the end portions of the first arms; and a support member having two third supporting points for rotatably supporting the end portions of the two second arms and supporting a semiconductor wafer to be conveyed. In this conveying apparatus, a semiconductor wafer supported on the support member is moved by extending and contracting the first and second arms with the first and second supporting points as articulated points. This type of frog-leg type conveying apparatus is disclosed in Published Unexamined Japanese Patent Applications 60-183736 (PCT/US84/00185) and 61-87351.

The above Japanese Patent Application 61-87351 discloses a frog-leg type conveying apparatus for moving the support member away from the base when the first and second arms are contracted into a superimposed state.

Theoretically, the support member for supporting a semiconductor wafer can be moved away from the base by moving the pair of first arms through an angle of 180°. Generally, a scalar robot is used for this type of conveying apparatus.

Since the scalar robot takes up a greater occupation area, it is not appropriate to locate the robot in a load/lock chamber of the semiconductor wafer treating apparatus which has to improve its throughput.

Further, in the case where the paired first and second arms are equal in length between their supporting points, a load acts upon the arms when the paired first and second arms are brought to their superimposed position and beyond. The load involved vibrates the conveying apparatus and produces a defective driving operation, preventing a smooth conveying operation.

SUMMARY OF THE INVENTION

It is accordingly the object of the present invention to provide a conveying apparatus which can smoothly move a support member, that is, a member supporting an article to be conveyed thereon, away from a base, as well as achieve less occupation space.

The object of the present invention as set out above can be achieved by a conveying apparatus which comprises a pair of first arms rotated with their first supporting points as their centers, the first supporting points being provided on the base in a spaced-apart relation; a pair of second arms provided on the end portions of the paired first arms and rotated with their second supporting points as their centers; a support member having two third supporting points rotatably supporting the end portions of the paired second arms, the support member supporting an article to be conveyed; means for moving the support member away from the base through the superimposition of their paired first and second arms; and variable means for varying at least one of a distance between the first supporting points and distance between the third supporting points.

In order to smoothly move the support member away from the base, either one of the paired first arms and second arms may have a flexible area for allowing their first arms or second arms to be deformed in their longitudinal direction.

Further, the base is rotated around a rotation shaft provided in a position situated on a locus of the movement of the support member and away from a line connecting together paired first supporting points.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a front view, including a partial cross-section, showing the whole of the conveying apparatus of FIG. 1;

FIG. 7 is a diagrammatic view showing a variant of a structure capable of varying a distance between supporting points FIG. 8 is a diagrammatic view showing another variant of the structure capable of varying a distance between supporting points;

FIG. 12 is a plan view diagrammatically explaining those arms whose rotation radiuses can be decreased on the conveying apparatus;

FIG. 13 is a front view diagrammatically explaining those arms whose rotation radiuses can be decreased on the conveying apparatus;

DETAILED DESCRIPTION OF THE PREFERRED EMBODIMENTS

A conveying apparatus according to an embodiment of the present invention will be explained below with reference to FIGS. 3 to 5.

Figure 3:
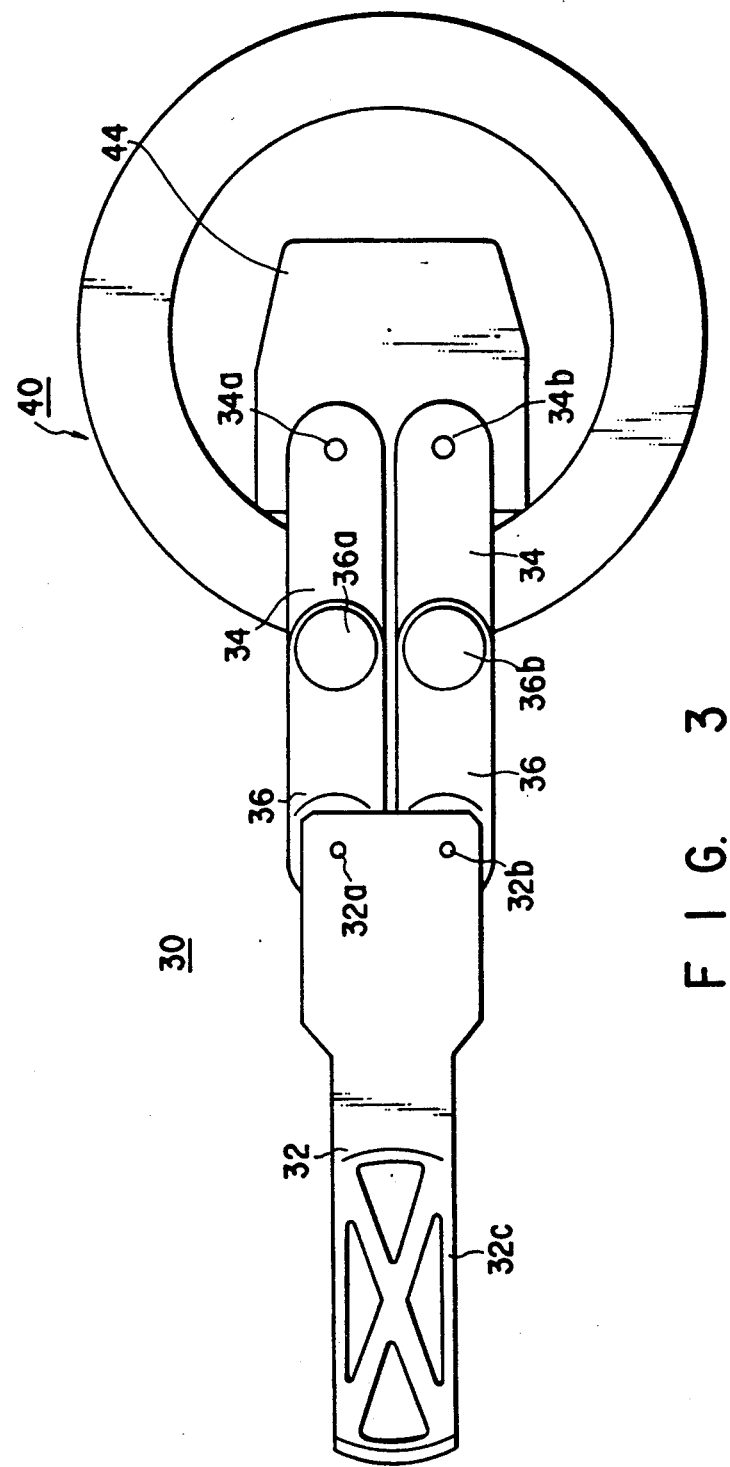
FIG. 3 is a plan view showing a whole of the conveying apparatus of FIG. 1.

As shown in FIGS. 3 to 4, the conveying apparatus 30 uses frog-leg type conveying arms. The conveying apparatus has a pair of first arms 34, 34 and pair of second arms 36, 36. The first arms 34, 34 are rotatably driven with first supporting points 34a, 34b as centers, the first supporting points 34a, 34b being provided on the base 40 in a spaced-apart relation. The second arms 36, 36 are rotatably driven with second supporting points 36a, 36b as centers, the second supporting points 36a, 36b being provided on forward end portions of the paired first arms 34, 34.

A top arm 32 is provided on the ends of the second arms 36 and 36 and has a pair of third supporting points 32a, 32b rotatably supporting the ends of second arms 36 and 36. A wafer rest section 32c is provided on the free end side of the top arm 32 so that an article to be conveyed, such as a semiconductor wafer, can be located on the wafer rest section 32c. By extending and contracting the first arms 34, 34 and second arms 36, 36 with first supporting points 34a, 34b and second supporting points 36a, 36b as articulated ones, the top arm 32 is movable, as will be set out below, on that side opposite to that in which the base 40 is located.

As shown in FIG. 4, a drive force transmission section 44 is provided on the base 40 to transmit a drive force from a drive source 42 to the first supporting points 34a, 34b.

Figure 5:
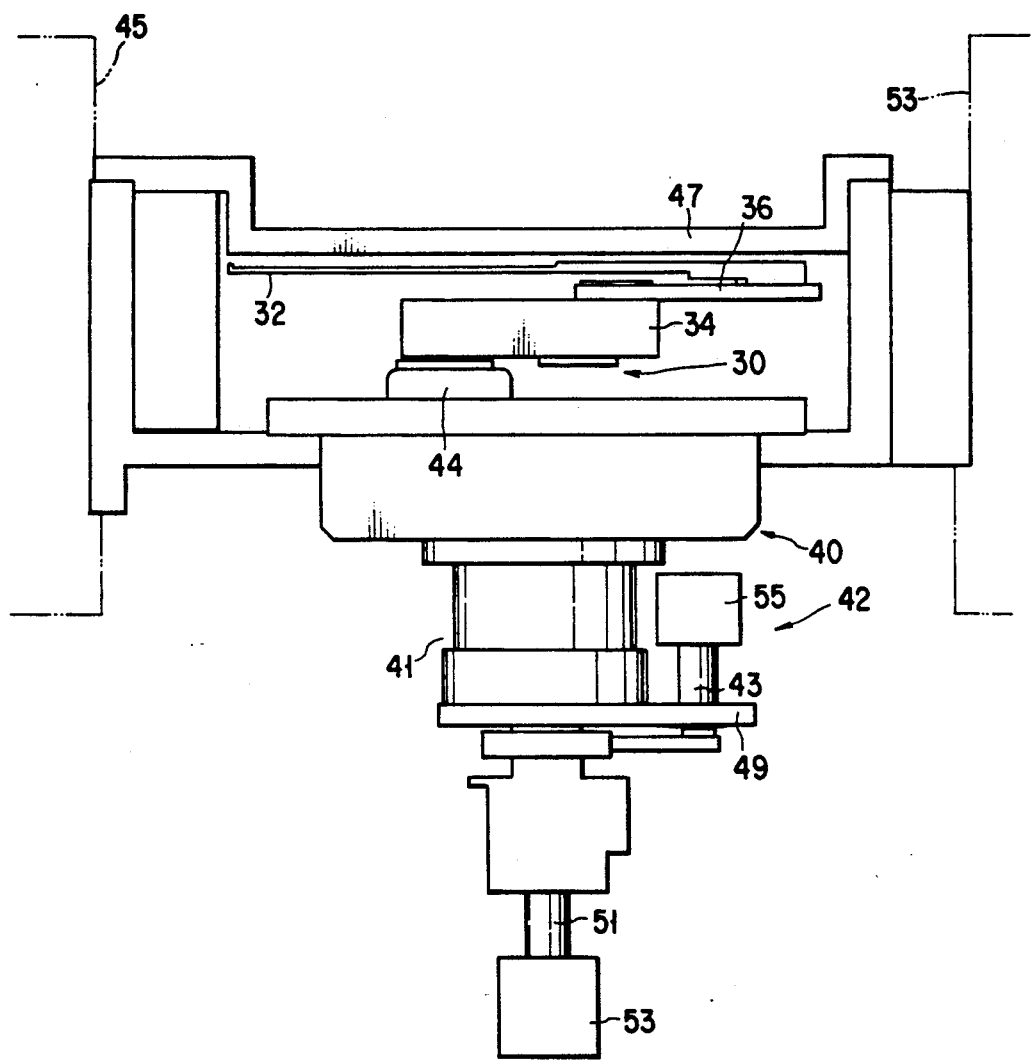
FIG. 5 is a diagrammatic view showing the conveying apparatus held in a load/lock chamber and a drive source for the conveying apparatus.

As shown in FIG. 5, in order to convey the semiconductor wafer, to be treated, from a sender 53 into a process chamber 45, a load/lock chamber 47 is located as a conveying chamber at a site between the sender 53 and the process chamber 45. When the semiconductor wafer is conveyed, the load/lock chamber 47 is held in a vacuum-tight state. The conveying apparatus is arranged in the load/lock chamber 47.

The drive source 42 has a first cylindrical rotation shaft 41 for rotatably driving the base 40 and second rotation shaft 51 for driving the first supporting points 34a, 34b and second supporting points 36a, 36b through the drive force transmission section 44. The second rotation shaft 51 is coaxially inserted into the first rotation shaft 41 such that its forward end side is connected to the first transmission mechanism in the drive force transmission section 44 as will be set out below. The first rotation shaft 41 and second rotation shaft 51 can be rotated independent of each other.

The first rotation shaft 4 is rotated with the rotation of a third rotation shaft 43 which is transmitted by, for example, a belt mechanism 49. The second rotation shaft 51 and third rotation shaft 43 are rotatably driven by motors 53 and 55, respectively.

In order that the vacuum-tight atmosphere held in the load/lock chamber 47 may be positively sealed from an outer atmosphere, a sealing member, not shown, is provided between the wall surface of the base 40 on one hand and the rotation shafts 51 and 41, on the other hand, at a boundary area of the base 40 between the vacuum-tight atmosphere in the load/lock chamber 47 and the outer atmosphere.

Between the second rotation shaft 51 and the first supporting point 34b, a first transmission mechanism, not shown, is provided in the drive force transmission section 44 and has a gear means to allow the first arm 34 to be counterclockwise rotated with the first supporting point 34b as a center. Between the first supporting points 34a and 34b, a second transmission mechanism, not shown, is provided in the drive force transmission section 44 and has gear means to allow the first arm 34 to be rotated with the first supporting point 34a as a center in which case the first arm 34 is rotated in a direction opposite to that in which the first arm 34 is rotated.

Between the first supporting points 34a, 34b and the second supporting points 36a, 36b, a drive mechanism, not shown, is provided in an arm cover 38 for covering the first arms 34 and 34 and adapted to rotatably drive the second arms 36 and 36 by the use of the first arms 34 and 34. The drive mechanism has gear means between the first supporting points 34a, 34b and the second supporting points 36a, 36b and is such that the second arms 36, 36 are rotated in a direction opposite to that of rotation of the first arms 34, 34 arranged in a straight-line relation to the second arms 36, 36 and that the rotation angle of the second arm (36, 36) becomes double that of the first arm (34, 34), the gear means using a timing belt, etc.

One form of a mechanism for smoothly moving the top arm 32 in a direction away from the base 40 will be explained below with reference to FIGS. 1 and 2.

Figure 1:
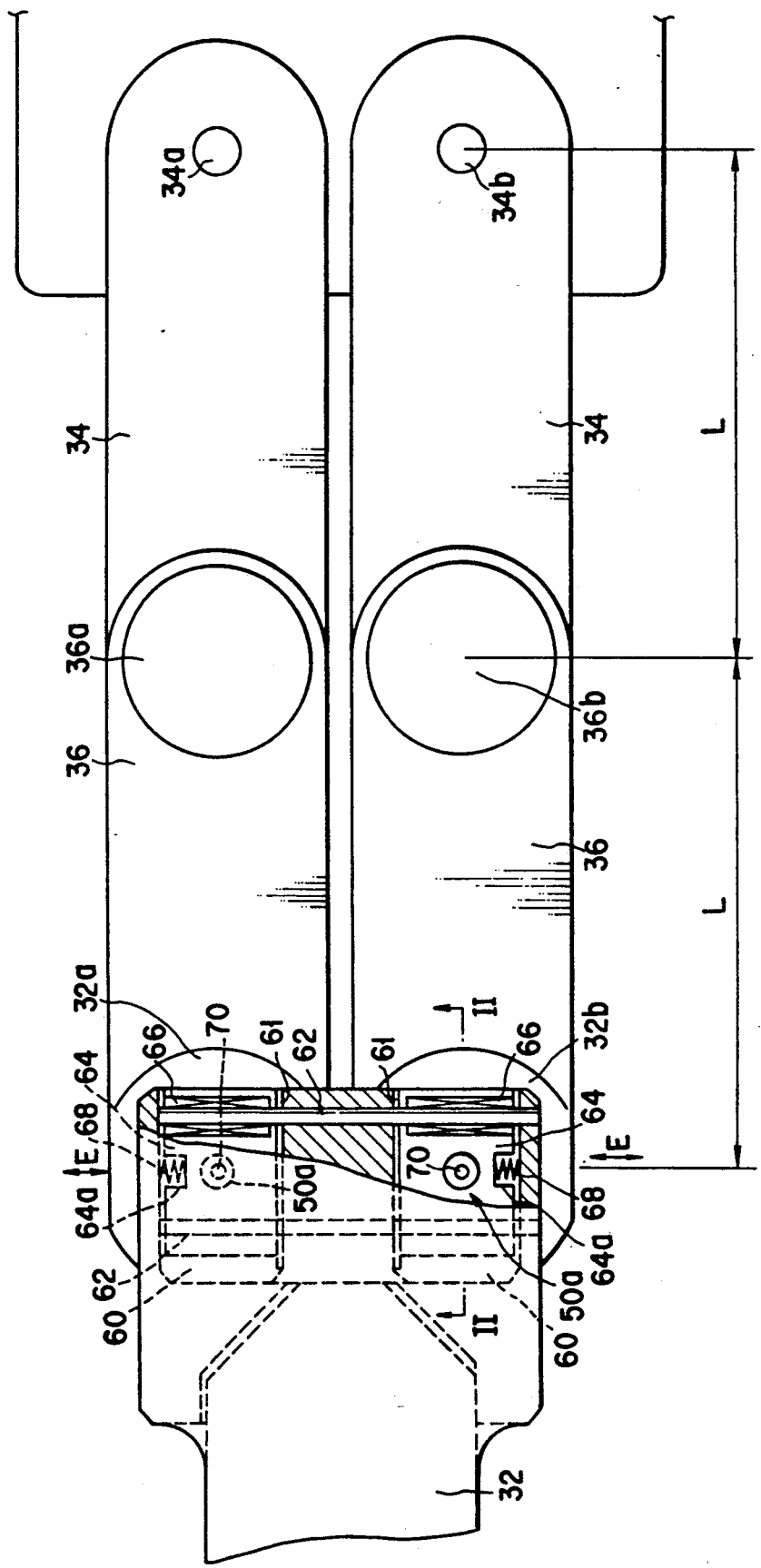
FIG. 1 is a plan view, partly taken away, showing a major section of a conveying apparatus according to a first embodiment of the present invention.
Figure 2:
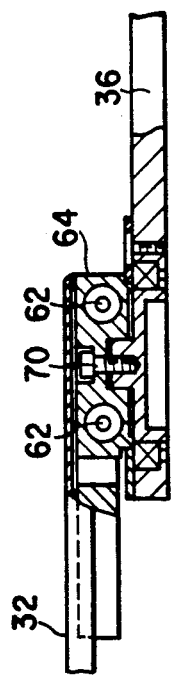
FIG. 2 is a transverse cross-section taken along line II—II on the conveying apparatus shown in FIG. 1.

As shown in FIG. 1, the distance L between the first support point (34a, 34b) and the second support point (36a, 36b) is set to be equal to the distance L between the second supporting point (36a, 36b) and the third supporting point (32a, 32b). The present mechanism is characterized in that the third supporting point (32a, 32b) is located at a point of connection between the top arm 32 and the second arms 36, 36.

A pair of recesses 60, 60 of a like configuration are provided on the reverse side of a base end portion of the top arm 32 such that they are located in a direction of width of the top arm 32. On the reverse end side of the base end portion of the top arm 32, two linear slide shafts 62, 62 are fixed in a manner to bridge the recesses 60, 60.

Slide housings 64, 64 are held in the recesses 60, 60 and have a width somewhat narrower than that of the recess. Slide housings 64, 64 are held with the shafts 62, 62 inserted therein through bearings 66, 66 and are movable in a direction as indicated by arrows E—E in FIG. 1.

Elastic members 61 are each held between the inner side wall surface of the recess 60 and the inside surface of the slide housing 64. Cutouts 64a, 64a are provided in the outside surfaces of the slide housings 64 and 64. A pair of compression coil springs 68, 68 are each provided between the side wall surfaces of the cutout 64a and recess 60. As a result, the slide housing 64 and 64 are urged inwardly to allow the elastic members 61, 61 to abut against the inside wall surfaces of the recesses 60, 60.

In this arrangement, the slide housings 64, 64 are, each, free to be movable inwardly or outwardly against an elastic force of the elastic member 61 or a compression coil spring 68.

Shafts 70, 70 are fixed to the forward end sides of the second arms 36, 36 and each serve as a supporting point. The shafts 70, 70 rotatably support the slide housings 64, 64 at their upper end sides as shown in FIG. 2. In this state, the top arm 32 is rotatably supported on the second arms 36, 36 by the slide housings 64, 64 having the shafts 70, 70.

The operation of the aforementioned conveying apparatus 30 will be explained below.

In order to move the top arm 32 from a position as shown in FIG. 3 in a direction away from the base 40, the rotation shaft 51 of the drive source 42 is rotatably driven. The rotation of the second rotation shaft 51 is transmitted through the first transmission mechanism in the drive force transmission section 44 to the first arm 34 on the first supporting point 34b side to cause the first arm 34 to be rotated counterclockwise and the first arm 34 on the supporting point 34a side to be rotated clockwise through the second transmission mechanism. The rotation of the first arms 34 and 34 is transmitted by the aforementioned drive mechanism in the first arms 34 and 34 to the second arms 36 and 36, causing the second arms 36 and 36 to be rotated in a direction opposite to that in which the first arms 34 and 34 are rotated.

Figure 6:
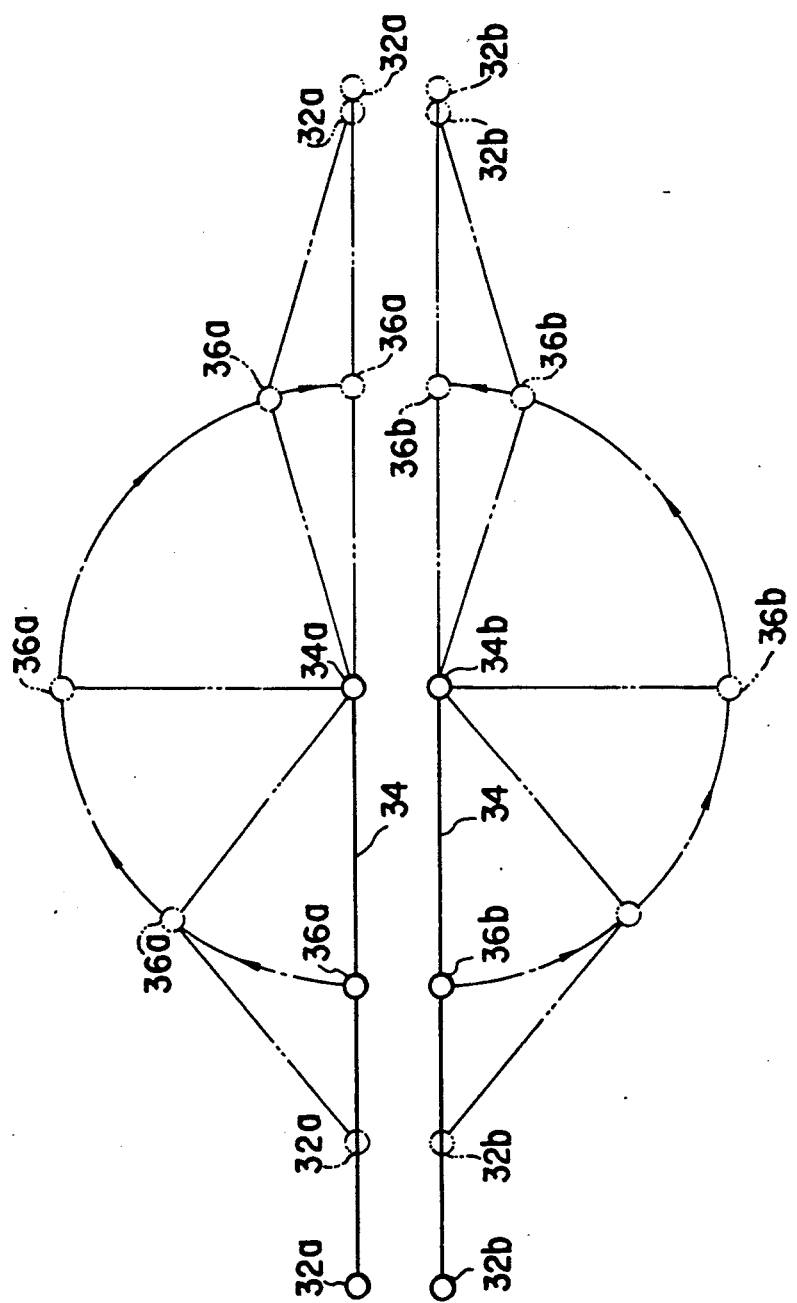
FIG. 6 is a diagrammatic view showing a locus of the movement of first arms.

FIG. 6 shows the locus of movement of the pair of first arms 34, 34. When, as shown in FIG. 6, the paired first arms 34 and 34 are rotated through an angle of 90°, the paired first arms 34 and 34 and paired second arms 36 and 36 assume a superimposed position with the paired arms 34 and 34 (36 and 36) oriented in a straight line fashion.

Conventionally, when the first arms 34, 34 and second arms 36, 36 were brought to their superimposed position and beyond, the apparatus 30 was vibrated, or was subject to a driving failure, due to an action of a load on their supporting points and arms, failing to perform a smoother conveying operation.

According to the present embodiment, since the slide housings 64, 64 having the shafts 70 and 70 as driven shafts are movable toward an outside, the load involved is accommodated by the movement of the slide housing 64, 64, thus obtaining a smooth drive operation.

That is, since the slide housings 64 and 64 can be moved, against the urging force of the compression coil springs 68 and 68, in an outward direction of the arrows E in FIG. 1 along the linear slide shafts 62 and 62, that is, since the distance between the third supporting points 32a and 32b can be varied, a clearance can be secured at the shafts 70, 70 when the paired first arms 34, 34 and paired second arms 36, 36 are brought to the superimposed position. It is possible to positively prevent the vibration of the apparatus and driving failure as set out above.

It is to be noted that, since the top arm 32 is fixed by the compression coil springs 68, 68 of equal urging force, it can be moved straight along a forward/ back direction irrespective of the movement of the slide housings 64 and 64.

A second form of a mechanism for smoothly moving the top arm 32 in a direction away from the base 40 by varying the distance between the third supporting points 32a and 32b will be explained below with reference to FIG. 7.

A flexible section is provided at a coupling member 80 for coupling the top arm 32 to the paired second arms 36, 36.

The coupling member 80 comprises a support member 82 having third support points 32a, 32b for rotatably supporting the pair of second arms 36, 36 and an arm fixing member 84 for fixing a top arm 32.

A T-cutout 86 is provided in the support member 82 and extends inward from the rear end of the support member 82. At a boundary between the support member 82 and the arm fixing member 84, a pair of cutouts 88, 88 are provided such that they extend toward a central area of that boundary in an opposed relation across the width of that boundary. When, at the movement of the first arms 34, 34 and second arms 36, 36 to their superimposed position and beyond, a load is inflicted on the supporting points and arms, the coupling member 80 is elastically deformed due to the presence of the cutouts 86 and 88, 88, causing a variation in the distance between the third supporting points 32a, 32b. As a result, it is possible to positively prevent the vibration of the conveying apparatus and driving failure.

A third form of a mechanism for smoothly moving the top arm 32 in a direction away from the base 40 by varying the distance between the third supporting points 32a and 32b will be explained below with reference to FIGS. 8 to 10.

Figure 9:
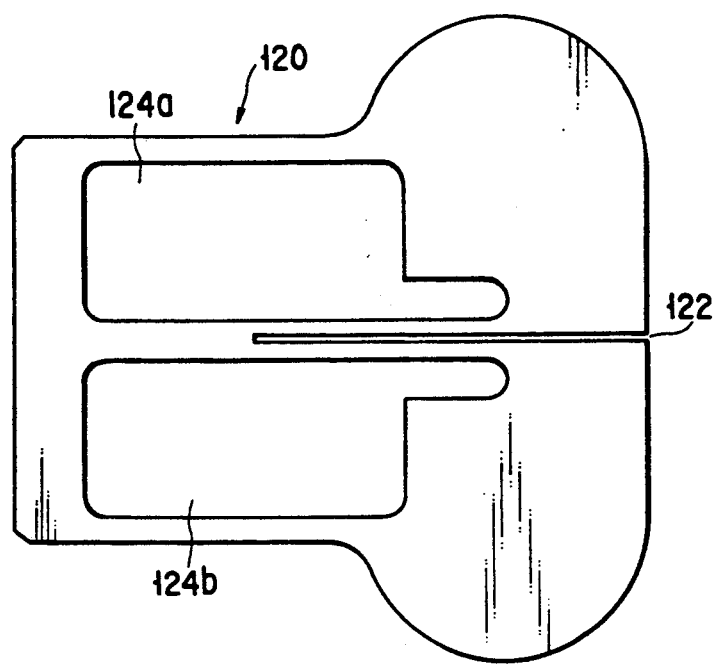
FIG. 9 is a plan view showing an arm holder in FIG. 8.
Figure 10:
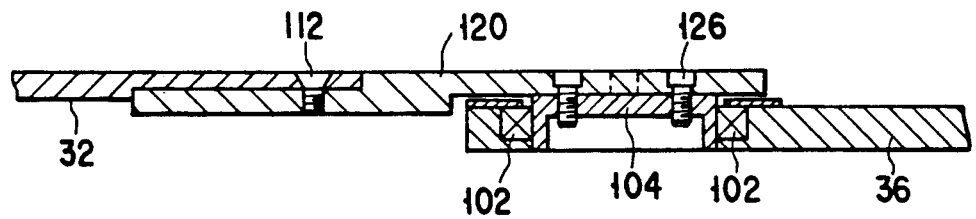
FIG. 10 is a longitudinal cross-section taken along line X—X of FIG. 8.

A pair of second arms 36, 36 are rotatably supported on a top arm 32 by an arm holder 120 shown in FIG. 9. A bearing 102 is provided on the forward end side of the second arms 36, 36 and rotatably supports a rotation body 104 provided on the forward end side of the second arms 36, 36. The rotation body 104 is fixed by screws 126 to the holder 120 which is, in turn, fixed by screws 112 to the top arm 32.

The holder 120 is formed of an aluminum sheet of, for example, 4 to 5 mm in thickness. The holder 120 has a slit 122 at a middle area of a location for which the two rotation bodies 104 and 104 are fixed. The slit 122 extends from the rear end of the holder 120 inward and has a width of about 1 mm. The holder 120 has a pair of cut openings 124a, 124b one at each side of the forward end of the slit 122. The cut openings 124a, 124b are about 20 mm wide 50 to 60 mm long. The dimensions of the slit 122 and cut openings 124a, 124b are substantially equal to those shown in FIG. 9.

When, at the movement of the first arms 34, 34 and second arms 36, 36 to their superimposed position and beyond, a load is inflicted on the supporting points and arms, the holder 120 is, while being opened outwardly with the inner end of the slit 122 as a boundary, elastically deformed, producing a variation in a distance between the supporting points of the third supporting points 32a, 32b. This prevents the vibration of the conveying apparatus and driving failure.

It is to be noted that the vibration of the conveying apparatus, as well as the driving failure, can be prevented by varying the distance between the first supporting points 34a, 34b. In this case, it is necessary to consider a relation of the first supporting points 34a, 34b to the shafts transmitting a rotation force to the supporting points 34a, 34b. It may be conceived that, for example, the first supporting points 34a, 34b are smoothly driven by their flexible shafts.

Another form of a mechanism for smoothly moving the top arm 32 in a direction away from the base 40 by deforming the conveying arm 36 (34) in the axial direction will be explained below with reference to FIG. 11.

Figure 11:
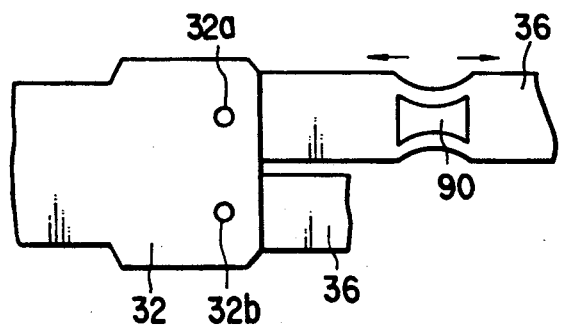
FIG. 11 is another variant of a structure for elastically deforming arms to allow their arm length to vary.

As shown in FIG. 11, the arms 36 have a cutout flexible area 90 partway of the second arm 36 to allow the arm 36 to be deformed in the axial direction under an action of a load involved.

When, at the movement of the first arms 34, 34 and second arms 36, 36 to a superimposed position and beyond, a load is inflicted on the supporting points and arms, the cutout flexible section 90 is deformed in the axial direction so that the load can be accommodated because the second arm 36 produces a variation in its axial length.

A conveying apparatus 30 according to a more preferred embodiment for rotating the arms 32, 34 and 36 as one unit will be explained with reference to FIGS. 12 and 13.

In the case where, for example, a semiconductor wafer is supplied by the conveying arm from the sender and enters a process chamber, it is necessary to rotate the conveying arm in a direction toward the sender and toward the process chamber. The rotation of the conveying ar is usually made by rotating the drive force transmitting section 44.

Figure 14:
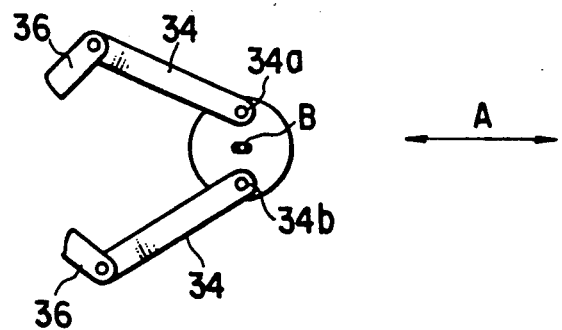
FIG. 14 is a plan view diagrammatically explaining those arms whose rotation radiuses are increased on a conventional conveying apparatus.
Figure 15:
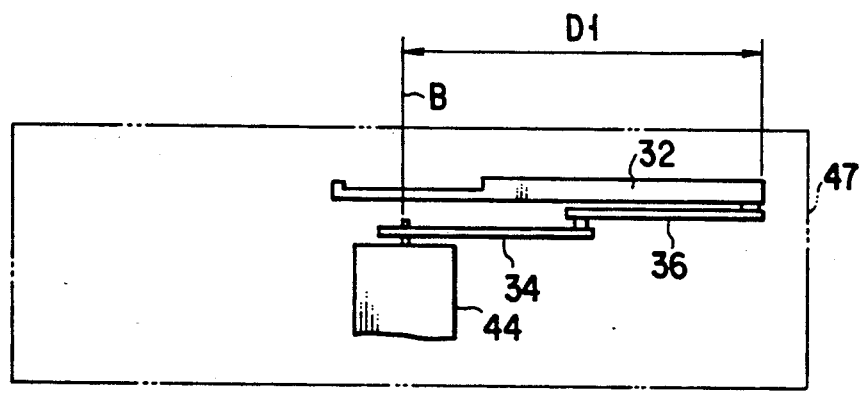
FIG. 15 is a plan view diagrammatically explaining those arms whose rotation radiuses are increased on a conventional conveying apparatus.

Conventionally, the rotation center B of the conveying arm was set at an intersection, as shown in FIG. 14, between a line whose direction A is a forward/back direction of the top arm 32 and a line connecting the first supporting point 34a to the first supporting point 34b. In this case, this rotation is realized in a position, in which the top arm 32 is driven in the back direction (see FIG. 15), increasing the rotation radius D1 of the conveying arm and hence the capacity of the load/lock chamber 47 where the conveying apparatus 30 is accommodated. This increases that dead space in the load/lock chamber 47 during the rotation of the conveying arm. It, therefore, takes a longer time to bring an atmospheric pressure state in the load/lock chamber 47 to a predetermined vacuum level.

In order to solve the problem, the rotation center B of the conveying arm is set, as shown in FIG. 12, at a vertex of an isosceles triangle with a point (34a)-to-point (34b) line as a base, noting that the vertex of the isosceles triangle is present in the back-moving direction of the top arm 32. The vertex is preferably located at a position one half the length of the top arm 32 when the top arm 32 is moved backward. In this case, the radius D2 of rotation of the conveying arm is made one half the length of the top arm 32, minimizing the capacity of the load/lock chamber 47 with the conveying apparatus 30 accommodated therein. By so doing, the dead space in the load/lock chamber 47 becomes smaller when the conveying arm is rotated. It takes less time to bring an internal state in the load/lock chamber 47 from the atmospheric pressure level to a predetermined vacuum level.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A conveying apparatus comprising first drive means having a first rotation shaft; a base rotated with a rotational drive of the first rotation shaft; second drive means having a second rotation shaft; a pair of first arms which, with the rotational drive of the second rotation shaft, are rotated with a pair of first supporting points as their centers, the pair of first supporting points being provided on the base in a spaced-apart relation; a pair of second arms rotated with a pair of second supporting points as their centers, the pair of second supporting points being provided on forward end portions of the paired first arms; a support member having a pair of third supporting points rotatably supporting forward end portions of the paired second arms, the support member supporting an article to be conveyed; means for linearly moving the support member beyond the base by achieving a superimposed state between the first and second arms; and variation absorption means for absorbing one of a variation in a distance between the first supporting points and variation in a distance between the third supporting points.

2. The conveying apparatus according to claim 1, wherein the variation absorption means comprises two slide members provided side by side in a direction of width of the support member; holding means for slidably holding the two slide members in the direction of width of the support member; and two support shafts for rotatably coupling together the paired second arms and two slide members.

3. The conveying apparatus according to claim 2, wherein the holding means has slide shafts inserted through the slide member and fixed to the support member such that each is placed across the width of the support member.

4. The conveying apparatus according to claim 2, wherein the two slide members are slidably located in corresponding recesses provided on a reverse surface side of the support member.

5. The conveying apparatus according to claim 2, further comprising elastic members located outwardly of the two slide members as viewed in a slide direction, and urging the slide member in a inward direction.

6. The conveying apparatus according to claim 5, wherein the elastic members are comprised of springs having an equal urging force.

7. The conveying apparatus according to claim 2, further comprising elastic members located inwardly of the two slide members as viewed in a slide direction.

8. The conveying apparatus according to claim 1, wherein the first rotation shaft is located at a location corresponding to substantially one half the length of the support member when the support member is moved backward.

9. The conveying apparatus according to claim 1, wherein the base is located in a vacuum-tight conveying chamber.

10. The conveying apparatus according to claim 9, wherein the first and second drive means are provided in an outer atmosphere.

11. The conveying apparatus according to claim 1, wherein the first and second rotation shafts are provided coaxial with each other.

12. The conveying apparatus according to claim 1, wherein the variation absorption means comprises a fist cutout section extending inwardly from a rear end portion of the support member in an axial direction and a second cutout section provided at each side of the first cutout section in a direction of width of the support member.

13. A conveying apparatus comprising first drive means having a first rotation shaft; a base rotated with a rotational drive of the first rotation shaft; second drive means having a second rotation shaft; a pair of first arms which, with the rotational drive of the second rotation shaft, are rotated with a pair of first supporting points as their centers, the pair of first supporting points being provided on the base in a spaced-apart relation; a pair of second arms rotated with a pair of second supporting points as their centers, the pair of second supporting points being provided on forward end portions of the paired first arms; a support member having a pair of third supporting points rotatably supporting forward end portions of the paired second arms, the support member supporting an article to be conveyed; and means for linearly moving the support member beyond the base by achieving a superimposed state between the first and second arms, wherein at least one of the pair of first arms and pair of second arms have a flexible area for allowing one of the pair of first arms and the pair of second arms to be deformed in their longitudinal direction.

14. The conveying apparatus according to claim 13, wherein the first rotation shaft is located at a location corresponding to substantially one half the length of the support member when the support member is moved backward.

15. The conveying apparatus according to claim 13, wherein the base is located in a vacuum-tight conveying chamber.

16. The conveying apparatus according to claim 15, wherein the first and second drive means are provided in an outer atmosphere.

17. The conveying apparatus according to claim 13, wherein the first and second rotation shafts are provided coaxial with each other.

* * * * *